United States Patent
Champion et al.

(10) Patent No.: US 9,134,377 B2
(45) Date of Patent: Sep. 15, 2015

(54) METHOD AND APPARATUS FOR DEVICE TESTING USING MULTIPLE PROCESSING PATHS

(71) Applicants: Corbin Champion, Tigard, OR (US); John R. Pane, Tigard, OR (US); Mark B. Donahue, Sherwood, OR (US)

(72) Inventors: Corbin Champion, Tigard, OR (US); John R. Pane, Tigard, OR (US); Mark B. Donahue, Sherwood, OR (US)

(73) Assignee: Teradyne, Inc., North Reading, MA (US)

( * ) Notice: Subject to any disclaimer, the term of this patent is extended or adjusted under 35 U.S.C. 154(b) by 205 days.

(21) Appl. No.: 13/826,038

(22) Filed: Mar. 14, 2013

(65) Prior Publication Data

US 2014/0281776 A1    Sep. 18, 2014

(51) Int. Cl.
  G01R 31/3177 (2006.01)
  G01R 31/3183 (2006.01)
  G06F 9/32 (2006.01)
  G01R 31/319 (2006.01)

(52) U.S. Cl.
  CPC .. G01R 31/318307 (2013.01); G01R 31/31919 (2013.01); G06F 9/322 (2013.01); *G01R 31/3177* (2013.01); *G01R 31/31903* (2013.01); *G01R 31/31917* (2013.01)

(58) Field of Classification Search
  CPC ........... G01R 31/31905; G01R 31/319; G01R 31/31917; G01R 31/31919; G01R 31/3183; G01R 31/318307; G01R 31/3177; G06F 9/3005; G06F 9/30054; G06F 9/30058; G06F 9/30061; G06F 9/32; G06F 9/322
  USPC ................. 714/738, 724, 726, 729, 742, 743; 702/117, 118, 120, 119
  See application file for complete search history.

(56) References Cited

U.S. PATENT DOCUMENTS

| | | | |
|---|---|---|---|
| 5,257,354 A | * | 10/1993 | Comfort et al. ................. 714/16 |
| 6,330,664 B1 | * | 12/2001 | Halvarsson ................... 712/239 |
| 2006/0150041 A1 | | 7/2006 | Yacobucci |
| 2008/0082886 A1 | * | 4/2008 | Rasmussen et al. .......... 714/738 |
| 2008/0235539 A1 | * | 9/2008 | Yamada ........................ 714/703 |

FOREIGN PATENT DOCUMENTS

JP    2010107507 A    5/2010

OTHER PUBLICATIONS

International Search Report and Written Opinion for PCT/US2014/011036 dated Apr. 25, 2014.

* cited by examiner

*Primary Examiner* — Albert Decady
*Assistant Examiner* — Christian Dorman
(74) *Attorney, Agent, or Firm* — Wolf, Greenfield & Sacks, P.C.

(57) ABSTRACT

According to some aspects, a method of operating an automatic test system comprising a plurality of paths and programmed with a test pattern is provided. One such method comprises executing vectors in the test pattern with circuitry comprising a plurality of paths, the executing comprising upon processing, in a first of the plurality of paths, the operation portion of a vector specifying an operation capable of generating a branch in the flow of execution of the vectors in the test pattern to a non-sequential location in the test pattern, initiating processing of the test pattern in a second of the plurality of paths from the non-sequential location. Some aspects include a system for executing instructions comprising a plurality of paths comprising control circuitry to initiate processing of operation portions from sequential locations of a memory within an available path of the plurality of paths.

22 Claims, 11 Drawing Sheets

| Location | Operation | Data |
|---|---|---|
| 0 | Branch Flag A | Location 10 |
| 1 | NOP | |
| 2 | NOP | |
| 3 | NOP | |
| 4 | NOP | |
| 5 | NOP | |
| 6 | NOP | |
| 7 | NOP | |
| 8 | NOP | |
| 9 | NOP | |
| 10 | Branch Flag B | Location 20 |
| 11 | NOP | |
| 12 | NOP | |
| 13 | NOP | |
| 14 | NOP | |
| 15 | NOP | |
| 16 | NOP | |
| 17 | NOP | |
| 18 | NOP | |
| 19 | NOP | |
| 20 | NOP | |
| 21 | NOP | |
| 22 | NOP | |

FIG. 3

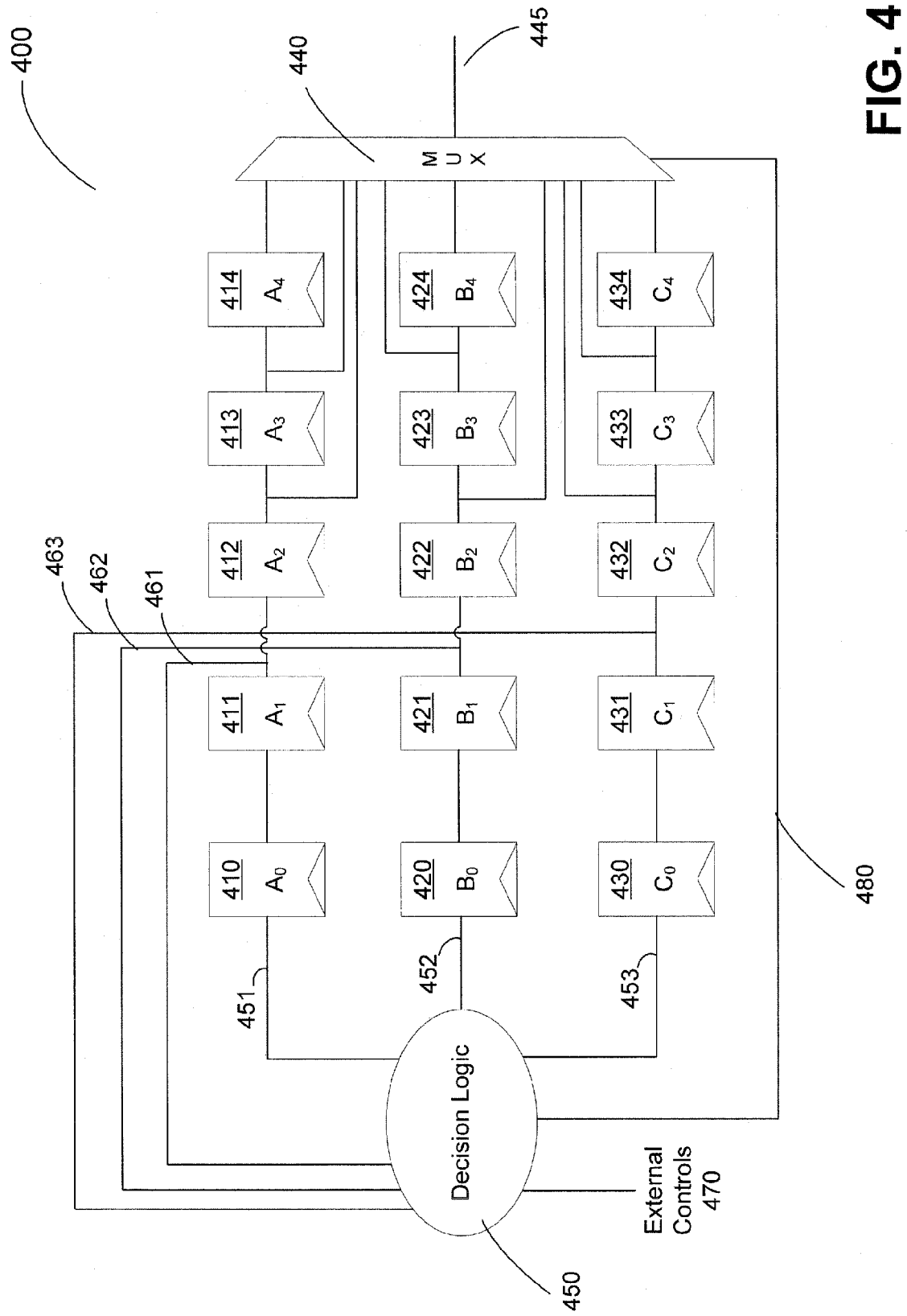

Cycle -4

|  | Register 0 | Register 1 | Register 2 | Register 3 | Register 4 |
|---|---|---|---|---|---|
| Path A | 0 |  |  |  |  |
| Path B |  |  |  |  |  |
| Path C |  |  |  |  |  |

Cycle -3

|  | Register 0 | Register 1 | Register 2 | Register 3 | Register 4 |
|---|---|---|---|---|---|
| Path A | 1 | 0 |  |  |  |
| Path B |  |  |  |  |  |
| Path C |  |  |  |  |  |

Cycle -2

|  | Register 0 | Register 1 | Register 2 | Register 3 | Register 4 |
|---|---|---|---|---|---|
| Path A | 2 | 1 | 0 |  |  |
| Path B | 10 |  |  |  |  |
| Path C | 12 |  |  |  |  |

Cycle -1

|  | Register 0 | Register 1 | Register 2 | Register 3 | Register 4 |
|---|---|---|---|---|---|
| Path A | 3 | 2 | 1 | 0 |  |
| Path B | 11 | 10 |  |  |  |
| Path C | 13 | 12 |  |  |  |

Cycle 0

|        | Register 0 | Register 1 | Register 2 | Register 3 | Register 4 |
|--------|------------|------------|------------|------------|------------|
| Path A | 20         | 3          | 2          | 1          | *0*        |
| Path B | 12         | 11         | 10         |            |            |
| Path C | 22         | 13         | 12         |            |            |

Cycle 1

|        | Register 0 | Register 1 | Register 2 | Register 3 | Register 4 |
|--------|------------|------------|------------|------------|------------|
| Path A | 21         | 20         | 3          | 2          | 1          |
| Path B | 13         | 12         | 11         | *10*       |            |
| Path C | 23         | 22         | 13         | 12         |            |

Cycle 2

|        | Register 0 | Register 1 | Register 2 | Register 3 | Register 4 |
|--------|------------|------------|------------|------------|------------|
| Path A | 22         | 21         | *20*       | 3          | 2          |
| Path B | 14         | 13         | 12         | 11         | 10         |
| Path C | 24         | 23         | 22         | 13         | 12         |

Cycle 3

|        | Register 0 | Register 1 | Register 2 | Register 3 | Register 4 |
|--------|------------|------------|------------|------------|------------|
| Path A | 23         | 22         | *21*       | 20         | 3          |
| Path B | 15         | 14         | 13         | 12         | 11         |
| Path C | 25         | 24         | 23         | 22         | 13         |

Cycle 4

|        | Register 0 | Register 1 | Register 2 | Register 3 | Register 4 |
|--------|------------|------------|------------|------------|------------|
| Path A | 24         | 23         | 22         | 21         | 20         |
| Path B | 16         | 15         | 14         | 13         | 12         |
| Path C | 26         | 25         | 24         | 23         | *22*       |

| Location | Branch to Start |
|---|---|
| 0 | 10 |
| 1 | |
| 2 | |
| 3 | |
| 4 | |
| 5 | |
| 6 | |
| 7 | |
| 8 | |
| 9 | |
| 10 | 20 |
| 11 | |
| 12 | |
| 13 | |
| 14 | |
| 15 | |
| 16 | |
| 17 | |
| 18 | |
| 19 | |
| 20 | |
| 21 | |
| 22 | |

FIG. 7

Cycle -2

|        | Register 0 | Register 1 | Register 2 |
|--------|------------|------------|------------|
| Path A | 0          |            |            |
| Path B |            |            |            |
| Path C |            |            |            |

Cycle -1

|        | Register 0 | Register 1 | Register 2 |
|--------|------------|------------|------------|
| Path A | 1          | 0          |            |
| Path B | 10         |            |            |
| Path C |            |            |            |

Cycle 0

|        | Register 0 | Register 1 | Register 2 |
|--------|------------|------------|------------|
| Path A | 2          | 1          | 0          |
| Path B | 11         | 10         |            |
| Path C | 20         |            |            |

Cycle 1

|        | Register 0 | Register 1 | Register 2 |
|--------|------------|------------|------------|
| Path A | 3          | 2          | 1          |
| Path B | 12         | 11         | *10*       |
| Path C | 21         | 20         |            |

Cycle 2

|        | Register 0 | Register 1 | Register 2 |
|--------|------------|------------|------------|
| Path A | 4          | 3          | 2          |
| Path B | 13         | 12         | 11         |
| Path C | 22         | 21         | *20*       |

Cycle 3

|        | Register 0 | Register 1 | Register 2 |
|--------|------------|------------|------------|
| Path A | 5          | 4          | 3          |
| Path B | 14         | 13         | 12         |
| Path C | 23         | 22         | *21*       |

Cycle 4

|        | Register 0 | Register 1 | Register 2 |
|--------|------------|------------|------------|
| Path A | 6          | 5          | 4          |
| Path B | 15         | 14         | 13         |
| Path C | 24         | 23         | *22*       |

METHOD AND APPARATUS FOR DEVICE TESTING USING MULTIPLE PROCESSING PATHS

BACKGROUND

An important stage in the fabrication of semiconductor devices is ensuring that a device is behaving as designed. This stage, known as "test," is often performed using automatic test equipment, or "testers," which analyze the behavior of the device automatically. Such automatic test equipment comprise complex electronics capable of sending test signals to, and measuring values of test signals from, one or more test points on one or more devices under test (DUTs).

For many types of tests, a tester needs to generate and/or measure test signals at a rate that corresponds to the rate at which the DUT is operating. Otherwise, there would be cycles of DUT operation in which no stimulus is provided to the DUT, which could cause incorrect operation of the DUT. Alternatively, there could be cycles of DUT operation in which the tester does not measure values at the DUT such that the tester may not detect incorrect operation of the DUT. Therefore, in order to test modern, high speed semiconductor devices, the tester must generate and measure test signals at a very fast rate.

The challenge of controlling test signal operations at a high rate is complicated by the fact that the tester may need to perform multiple operations to generate or measure test signals for each cycle of DUT operation. For some tests, the operations performed in the tester to generate or measure a test signal are defined by a test pattern. In operation, circuitry inside the tester, called a "pattern generator," may execute the pattern. The pattern generator must execute the test pattern at a rate that allows the tester to generate and measure test signals at a rate that ensures there are test signals for every cycle of DUT operation.

The test pattern may specify, for each of numerous tester cycles, what signals to send to, or that are expected to be measured at, each of numerous test points on the DUT. These tester cycles may be the same as or faster than the cycles of DUT operation such that tester operations are specified for every cycle of DUT operation.

A test pattern contains a sequence of vectors, each of which specifies the operation of channel circuitry that can generate or measure a test signal for one cycle of the tester's operation. In addition, a vector may contain information that specifies a subsequent vector to be executed. In some instances, the information in a vector may indicate that the next vector to be executed is stored in a memory at a location following the vector being executed. Execution in this way is said to be sequential. However, in other instances, this information in a vector specifying the next vector to be executed may specify a non-sequential location such that execution of the test pattern "branches." In some instances, these branches may be conditional branches such that the order in which vectors in a test pattern that are executed may be dynamically determined based on the observed responses from the DUT or on other conditions that the tester hardware is constructed to identify.

Conditional branches increase the challenge of quickly executing a test pattern. In a conventional microprocessor, fast execution of program instructions can be achieved through a pipelined architecture. With a pipelined architecture, circuitry to perform an instruction is divided into pieces, which are called ranks. The ranks are separated by registers or other data storage components such that when processing within one rank is completed, the result may be stored in a register until the next rank is ready to process it. The circuitry within a pipeline can be controlled so that, when a rank in the pipeline is processing a portion of one instruction, the preceding rank is processing a portion of the next sequential instruction.

Circuitry within each rank likely can complete processing on a portion of an instruction faster than circuitry configured to perform the entire instruction. As a result, pipelined circuitry can process a sequence of instructions at a faster rate than non-pipelined circuitry.

A tradeoff of this faster rate of processing of sequential operations is that there is latency between when the pipeline begins to execute an instruction and when results of that processing are first available. Because each rank in the pipeline needs to wait for the preceding rank to generate an output before it can begin processing for an instruction, the pipeline does not produce an output for the first instruction in a sequence until each rank has processed that operation such that the time to the first result is the sum of processing delays in all of the ranks. Thereafter, the pipelined circuitry can produce outputs at a rate set by the longest processing time in a single rank.

This additional delay when a sequence of instructions is first provided for processing creates a disruption in output of the pipelined circuitry if a new sequence of instructions is supplied for execution. Such a disruption occurs when a conditional branch instruction is executed. A branch defines a new starting point for a sequence of instructions to be processed. Because it is not known whether the branch will be taken until after the conditional branch instruction is executed, a new sequence of operations cannot be applied to the pipeline until a result of executing the conditional branch instruction is available. Thus, no output of the pipeline is supplied if the branch is taken until after that delay associated with restarting.

The pipeline is said to be "stalled" during this delay. In a conventional microprocessor, the delay associated with a stalled pipeline is on average offset by the faster rate at which instructions can be executed after the stall. However, in a tester such a disruption in processing vectors in a test pattern is undesirable because there could be cycles of DUT operation during which processing is stalled, creating the possibility that input is not supplied to the DUT or a result is not measured at the appropriate time, impacting results of a test.

To allow faster execution without impacting the results of a test, some testers are designed with very fast circuitry such that, even if multiple tester cycles are required to execute a vector, execution may be completed within one cycle of DUT operation. However, such high speed circuitry may be expensive. Alternatively, some testers may be designed to execute test patterns with a limited amount of conditional branching. However, such an approach limits functionality of the tester.

SUMMARY

Some embodiments include a method of operating an automatic test system programmed with a test pattern comprising a plurality of vectors, the plurality of vectors each being associated with a location within the test pattern, and each of at least a portion of the plurality of vectors comprising an operation portion and a data portion, the operation portion defining an operation to determine a location of a subsequent vector during execution of the test pattern, and the data portion at least in part characterizing actions to be performed by the test system to generate or measure test signals at a plurality of test points of a device under test upon execution of the vector, the method comprising executing vectors in the test pattern with circuitry comprising a plurality of paths, each of the plurality of paths configured for processing operation portions of vectors, the executing comprising upon processing, in a first of the plurality of paths, a vector comprising an operation portion specifying an operation capable of generating a branch in the flow of execution of the vectors in the test pattern to a non-sequential location in the test pattern, initiating processing of the test pattern in a second of the plurality of paths from the non-sequential location.

Some embodiments provide a system for executing instructions defining a program, the instructions each being associated with a location within the program, and each of at least a portion of the plurality of instructions comprising an operation portion and a data portion, the operation portion defining an operation to determine a location of a subsequent instruction during execution of the program, and the data portion at least in part characterizing an action to be performed by the system upon execution of the instruction, the system comprising memory adapted to store at least the operation portion of the instructions of the program, a plurality of paths, each of the plurality of paths comprising circuitry for processing operation portions of instructions from sequential locations in the memory, each of the paths being coupled to receive an operation portion of an instruction from the memory, each of the plurality of paths comprising operation processing circuitry for determining whether execution of an operation portion of an instruction could result in a branch to a non-sequential location in the program, control circuitry to initiate processing of operation portions from sequential locations of the memory within an available path of the plurality of paths, the processing being initiated based on processing of an operation portion within an active path indicating a branch, the processing in the available path being initiated from the destination of the branch, and classify an active path as available upon determining that execution of the program did not branch to the destination at which sequential processing was initiated for the path, a multiplexer having an output, the multiplexer being coupled to the plurality of paths to select and present at the output a value from an active path of the plurality of paths, and a data processing circuit coupled to the output of the multiplexer and configured to process a data portion of an instruction at a location within the program indicated by the value at the output of the multiplexer.

Some embodiments include a method of operating a system for executing a plurality of instructions defining a program in a plurality of successive cycles, the plurality of instructions each being associated with a location within the program, and each of at least a portion of the plurality of instructions comprising an operation portion and a data portion, the operation portion defining an operation to determine a location of a subsequent instruction during execution of the program, and the data portion at least in part characterizing an action to be performed by the system upon execution of the instruction, the method comprising operating a plurality of paths to process, in each of a plurality of the sequential cycles, operation portions of instructions at sequential locations within the program, and in each of the plurality of the sequential cycles, accessing a data portion of an instruction of the program based on a value selected from a path of the plurality of paths, wherein the locations within the program from which operation portions of instructions are processed are different in different ones of the plurality of paths, and for at least a portion of the plurality of paths, the location from which an instruction is processed in a cycle depends on processing of an operation portion of an instruction in a different path in a prior cycle of the plurality of cycles.

The foregoing is a non-limiting summary of the invention, which is defined only by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3 depicts an exemplary test pattern comprising a plurality of vectors, suitable for practicing some embodiments described herein;

FIG. 4 is a schematic view of a first exemplary pattern generator processing logic, according to some embodiments;

FIGS. 5A-I depict a plurality of processing paths processing test pattern vectors during multiple cycles of a test pattern generator, in accordance with some embodiments;

FIG. 7 depicts an exemplary lookup storing test pattern locations, in accordance with some embodiments;

FIGS. 8A-G depict a plurality of processing paths processing test pattern vectors during multiple cycles of a test pattern generator, in accordance with some embodiments.

DETAILED DESCRIPTION

Figure 1:
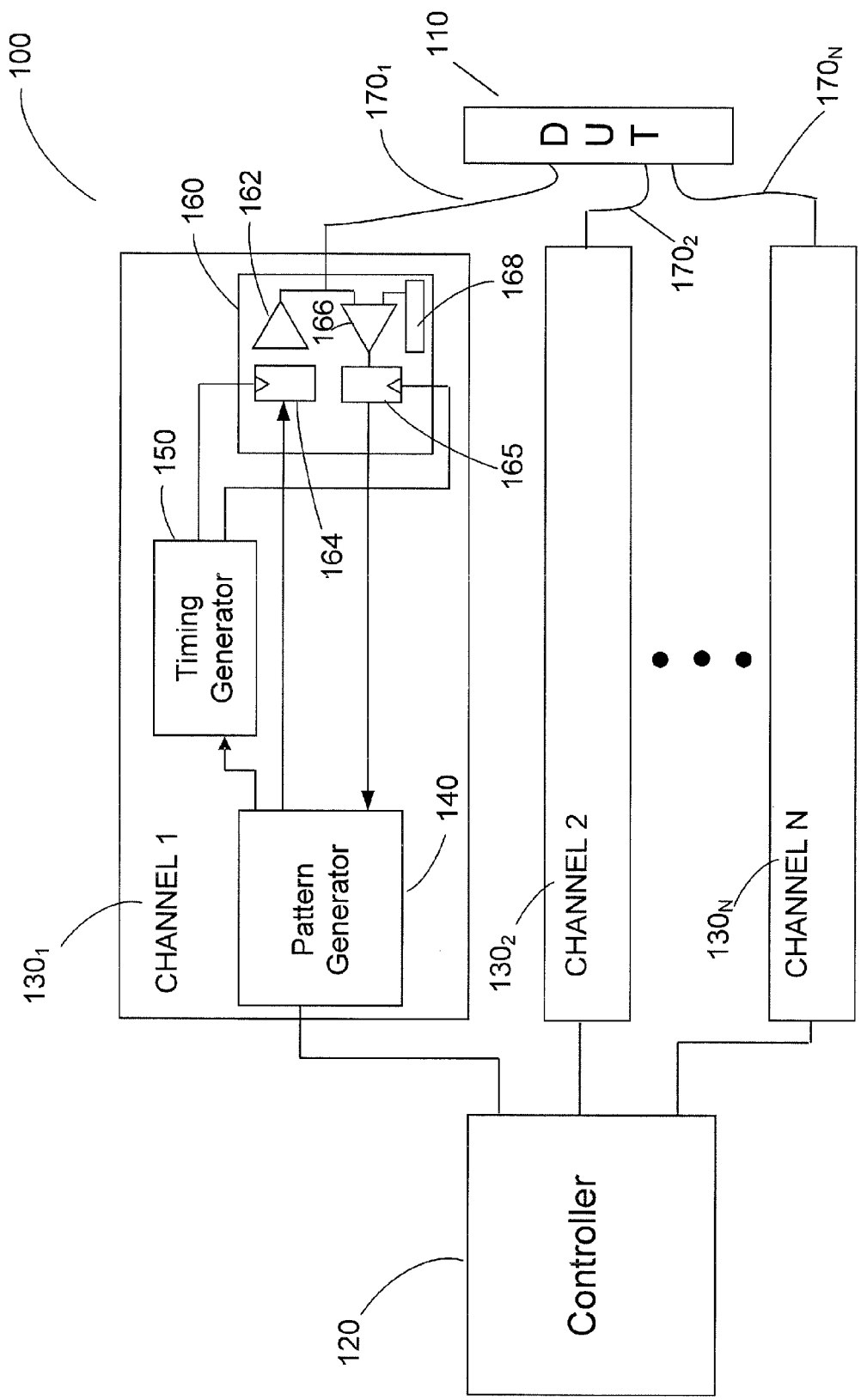
FIG. 1 illustrates a system suitable for testing a device using automatic test equipment that may be used in connection with any of the embodiments of the invention.

The inventors have recognized and appreciated that a high speed and high functionality tester may be created through the use of pattern generator circuitry with multiple paths for processing operation portions of vectors in a test pattern. Sequential processing from different locations in the test pattern may be initiated, or terminated, in each of the paths based on conditional branch instructions within the test pattern and detected conditions that indicate whether a particular branch will be taken. Within each path, pipelined circuitry may be used.

In each of multiple cycles, a value within a path may be selected and used to identify a vector. Selection of a value may entail selecting both a path and a rank within the pipelined circuitry of that path from which to obtain the value. The selected value may be used to identify a vector, and the data portion of that vector may be used in controlling the tester to generate or measure test signals for one cycle.

Such a pattern generator may provide high functionality in contrast to current techniques that run a tester with a reduced feature set that limits the vector types available. While these current techniques may simplify the pattern generator hardware and allow it to execute vectors at a faster rate, they may limit the types of tests that can be performed.

As an example, a pattern generator constructed according to the techniques described herein may allow same-cycle branching. In contrast, some current techniques used in pattern generator design preclude proper execution of test patterns that include same-cycle branching. Such a scenario can arise when a conditional branch operation is allowed to direct execution to another conditional branch operation. In order to run a tester such that a vector is provided to the DUT every DUT cycle, a tester would need to be able to determine the result of a conditional branch instruction within a single cycle of the pattern generator hardware. This timing accommodates a scenario in which execution of the first conditional branch transfers execution to the second conditional branch operation in one cycle, by enabling the subsequent operation to be determined and available for use in the next cycle. Otherwise, no instruction would be available for execution in the cycle following execution of the second conditional branch operation, potentially yielding incorrect test results.

The inventors have recognized and appreciated that an improved test pattern generator may be constructed by using a plurality of processing paths, each of which may be pipelined to provide a sequence of locations within a test pattern from which test vectors are obtained for sequential execution. Processing circuitry may also process the operation portions of vectors as they are processed within a path to determine whether a particular operation could trigger a branch to a non-sequential location.

If an operation could trigger a branch to a non-sequential location, sequential execution from possible destinations that could arise from transferring execution to that non-sequential location may be initiated in one or more other paths. The possible destinations may, in some embodiments, encompass destinations that could result in one, two or more cycles following that branch operation. The number of cycles into the future may correspond to the number of cycles the hardware will spend computing the destination of the conditional branch.

For example, in some embodiments hardware may use two cycles to compute possible destinations of a conditional branch. In this scenario, a first conditional branch operation, executed in a first path, could transfer execution to a second location in the test pattern that contains a second conditional branch operation. In response to processing the first conditional branch, the hardware may initiate sequential execution from the second location in a second path. If the second conditional branch could transfer execution to a third location, the hardware may also initiate sequential execution from that location in a third path. Though, because execution from the second location and the third location would happen in different future cycles, sequential execution from the third location in the third path could be initiated in different cycles so that the value of execution from the third location will be at a different rank in a pipeline than execution initiated from the second location. In this way, regardless of which conditional branch operations result in non-sequential execution, by selecting an appropriate path and rank, a value indicating the appropriate location from which to acquire a vector may be selected in the cycles following the first conditional branch.

The pattern generator hardware may apply this approach of initiating sequential execution in additional paths for whatever operation portion of a vector is processed in each path. For example, there may be a further conditional branch operation in the test pattern following the first conditional branch. As sequential processing continues in a first path, this further conditional branch operation may be processed, triggering sequential execution initiated from yet other locations in yet other paths. Likewise, as operation portions of vectors are processed in the second and third paths, conditional branch operations may be processed in those paths, which triggers processing in yet further paths.

Repeatedly establishing processing from different locations in a test pattern in different paths in this fashion may eventually lead to using all available paths in a pattern generator. If that happens, subsequent processing of a conditional branch in any of the paths may not produce proper operation of the test system. To reduce the risk of this condition occurring, paths may be "pruned." Pruning may occur once it is determined, based on conditions determined as vectors are executed, that vectors will not be executed from the location for which processing in a path was initiated. For example, once it is determined that execution of a test pattern will not branch at a conditional branch instruction, all paths established in response to processing that conditional branch may be "pruned." In this context, pruning may entail suspending processing of operations on the circuitry of the path. Though, pruning a path may be achieved in any suitable way, such as marking the path available for re-use.

It should be appreciated that the particular methods of adding and pruning paths described herein are provided as examples and any approach which makes a path available or unavailable to the system may be utilized as the system is not limited in this respect.

In processing conditional branch operations, the pattern generator hardware may determine in any suitable way the locations from which non-sequential processing could initiate in one or more cycles following a conditional branch operation. In some embodiments, the possible locations may be dynamically computed by circuitry within the pattern generator. As another example of a suitable approach, in other embodiments, the possible locations may be computed in advance by analysis of a test pattern. In such a scenario, that analysis may be done by software executing on a computer that may be separate from the tester. The possible locations for each vector might then be stored in connection with the test pattern, such that determining the locations may be achieved by reading those values.

In some embodiments, a test system may be configured to provide single-cycle branching capability by making use of the plurality of processing paths. By determining the possible vectors that may be executed in one or more cycles subsequent to the execution of a branch vector, single-cycle branching capability may be provided in which any number of branch operations may be executed sequentially. Though, it should be appreciated that, in some embodiments, constraints may alternatively or additionally be placed on the test pattern that may be executed. Imposing constraints may reduce the functionality of the tester, though may allow test patterns to be executed faster without the need for more expensive high speed hardware. Alternatively, less expensive, lower speed circuitry configured as described herein might be used in connection with reduced functionality to provide a lower cost tester. Accordingly, it should be appreciated that the techniques described herein may be applied in any suitable combination to achieve any suitable goal, and the invention is not limited to the specifically described embodiments or advantages.

Following below are more detailed descriptions of various concepts related to, and embodiments of, methods and apparatus associated with a system of operating an automatic test system comprising one or more processing paths. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 illustrates a system suitable for testing a device using automatic test equipment that may be used in connection with any of the embodiments of the invention. In particular, FIG. 1 illustrates tester 100 that comprises controller 120 which controls channels $130_1$, $130_2$, ... $130_N$ to, for each cycle, generate signals for, or measure signals from, a device under test (DUT) 110. Channels $130_1, 130_2, \ldots 130_N$ send and receive test signals to or from DUT 110 via lines $170_1, 170_2, \ldots 170_N$, respectively. It will be appreciated that N may take any suitable value depending on the needs of the testing system.

Controller 120 may include, for example, a computer programmed to direct the testing process carried out by tester 100. Such an exemplary controller may further collect and/or process data during tests and may provide an interface to an operator. Controller 120 may also include circuitry shared by multiple of the channels $130_1, 130_2, \ldots 130_N$.

In the example of FIG. 1, channel $130_1$ is shown in additional detail, and includes pattern generator 140, timing generator 150 and pin electronics 160. Pattern generator 140 performs execution of a test pattern that defines the operation of the test channel $130_1$ during each cycle of the test system. For example, an operation may execute a vector in the test pattern that causes the test system to interact with DUT 110. Such interaction may include driving one or more test signals to one or more test points on DUT 110, and/or receiving one or more test signals from one or more test points on DUT 110. An automatic test system, such as system 100, programmed with a test pattern may store the test pattern in any suitable location such that the pattern generator is able to retrieve and execute vectors from the test pattern. As a non-limiting example, the test pattern may be stored in a memory located within system 100, e.g., within pattern generator 140.

Timing generator 150 creates timing signals that control the transitions between test signals. For example, timing generator 150 may define the start time when a test signal begins to be provided to DUT 110, or the time at which a test signal provided from DUT 110 should be measured.

Pin electronics 160 provide an interface for test signals sent to and received from DUT 110 via line $170_1$. In particular, pin electronics 160 include drive circuitry that provide the test signals to one or more test points on DUT 110, and include detection circuitry that receives test signals from one or more test points on DUT 110. The drive circuitry includes driver 162 and flip-flop 164. Flip-flop 164 is clocked by the timing signal provided by timing generator 150 and is supplied with data from pattern generator 140. Thereby, flip-flop 164 is able to control the particular test signal output by driver 162 and the time at which it is output.

Pin electronics 160 may also detect test signals from DUT 110 via line $170_1$ and comparator 166. The comparator receives test signal(s) provided from one or more test points on DUT 110 in addition to a reference value provided by programmable reference value generator 168. Comparator 166 may determine whether received test signal(s) match a specified value, or a range of specified values, provided from the programmable reference value generator 168. For example, comparator 166 may be used to determine whether test signals received from DUT 110 match the expected results of the test being performed, and may provide a high or low value based on whether a test signal is above or below an expected value. Latch 165 is clocked by timing generator 150, and effects the output of comparator 166 sent to pattern generator 140 for further processing.

The example of FIG. 1 is provided as a non-limiting example of providing test signals to, and receiving test signals from, a device under test using a pattern generator. However, any suitable implementation of an automatic test system may be used as the invention is not limited in this respect. It will be appreciated that FIG. 1 is provided as a conceptual example of performing test, and that actual circuitry in a test system may include components not shown in FIG. 1, and/or may connect the components shown using a different configuration. For example, in actual circuitry the pattern generator may not provide the clock or data to flip-flop 164 or latch 165; rather, the pattern generator may provide control signals to timing generator 150 and may receive control signals from the timing generator and/or other components in the system.

Figure 2:
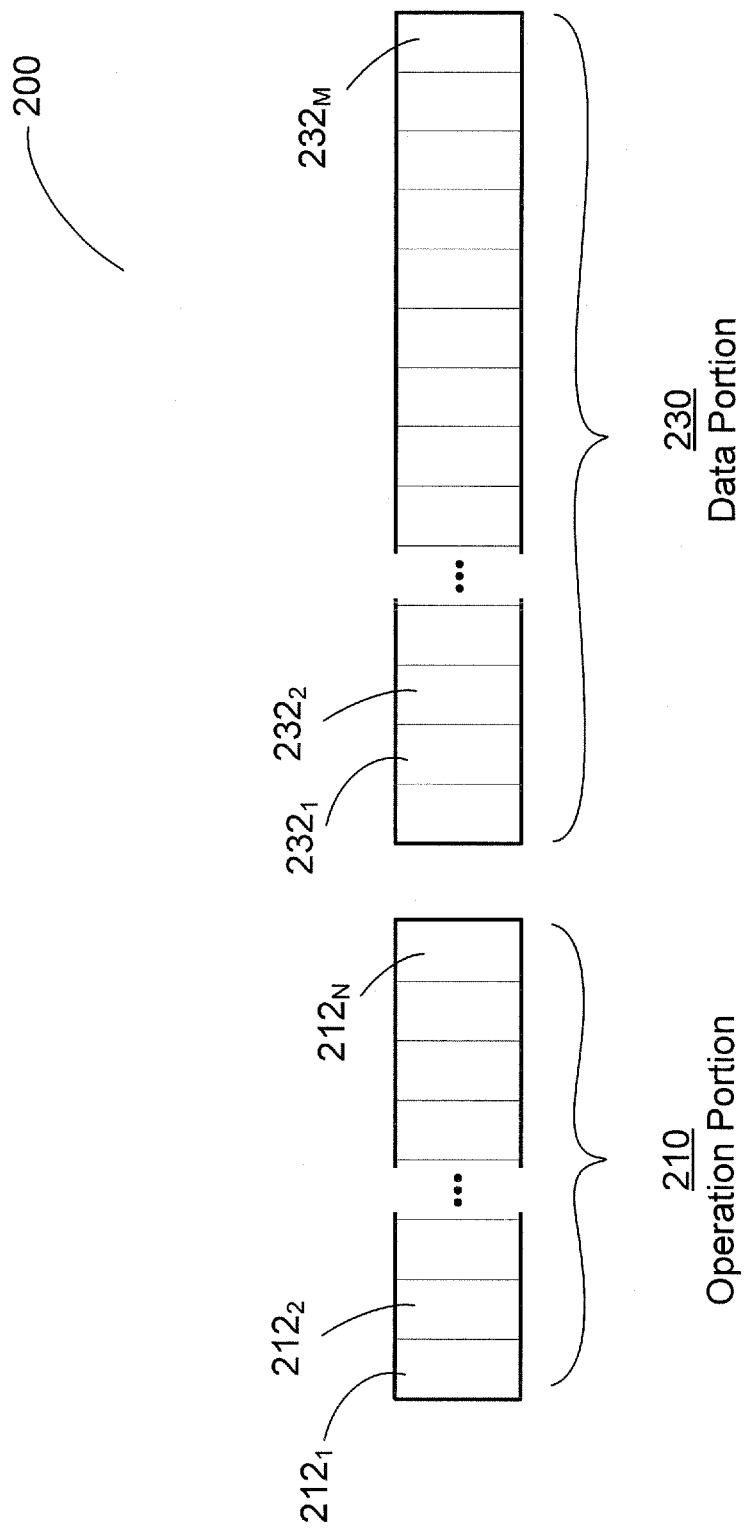
FIG. 2 depicts the structure of a vector of a test pattern according to some embodiments.

As described above, a test pattern may be supplied to a device under test in order to perform automatic testing of the device. For example, such automatic testing may be performed using system 100 depicted in FIG. 1. A test pattern may be configured in any suitable way to provide test signals to a device under test and/or to measure test signals from the device under test. FIG. 2 provides an example of one such test pattern configuration.

In the example of FIG. 2, a test pattern contains a sequence of vectors, each of which specifies the operation of channel circuitry that can generate or measure a test signal for one cycle of the tester's operation. FIG. 2 depicts an exemplary configuration of one vector in the sequence of vectors, according to some embodiments.

In FIG. 2, vector 200 includes an operation portion 210 and a data portion 230. Operation portion 210 includes operation elements $212_1, 212_2, \ldots 212_N$ which may be used to define the next vector to be executed. For example, particular values of the operation portion may indicate that vector 200 will, when executed, perform a branch operation, which may be conditional. The operation elements may each comprise any suitable element, such as a digital bit (i.e., a value of 0 or 1).

Data that may configure the test system to perform specific testing operations may be specified by the data portion 230 of the vector. Data portion 230 includes data elements $232_1, 232_2, \ldots 232_N$ each of which may comprise any suitable element, such as a digital bit (i.e., a value of 0 or 1). For example, the data portion may indicate one or more values to be written to one or more test points on a DUT when the vector is executed. As another example, the data portion may indicate one or more values to be read from one or more test points on the DUT when the vector is executed. In some embodiments, each vector in a test pattern has a data portion that specifies test data to provide to, and/or receive from, one or more test points on a DUT. In some embodiments to avoid a stall of the test system operations, which may possibly lead to incorrect test results, one vector may be executed in each of numerous tester cycles.

Each vector, such as vector 200, may be associated with a location in the test pattern, which may indicate the order in which vectors are executed. For example, a test system may execute vectors sequentially by selecting sequential location values and executing vectors at those locations. For example, if a vector at location 1 is executed, the next vector executed may be the vector at location 2, then the vector at location 3, etc. The location associated with each vector in the test pattern may comprise explicit data stored with the vector, or may be implied based on the order of the vectors as they are stored in, or received by, the test system. For example, a vector may be considered to be at location 0 simply because it is the first vector received to be executed by the test system, though may also have a location defined by the position in a memory at which it is stored. In some embodiments, a test pattern comprising vectors may be stored in a memory, in which case address locations in the memory may be correlated with locations in the test pattern.

Some vectors may have an operation portion that defines the type of the vector to be a branch type, which when executed result in non-sequential execution of vectors. For example, a vector at location 1 may have an operation portion that identifies the vector to be of the branch type, which may indicate that the flow of execution of the vectors in the test pattern will branch to a non-sequential location in the test pattern, for example location 15. Consequently, in this example, the next vector executed after the vector at location 1 would be the vector at location 15. The destination of a branch may be defined, for example, by the operation portion of the vector, though it should be appreciated that any suitable technique may be used to determine the destination of a branch.

Additionally, some vectors may be of the branch type yet only generate a branch when some particular condition is met. That is, while the vector may specify an operation that is capable of generating a branch, the generation of the branch may depend on certain conditions. Such a vector may have an operation portion that distinguishes this "conditional branch" type of vector from the branch type of vector described above wherein the branch is always generated. In addition, vectors may be configured such that there are a plurality of operation portion values that each indicate a different type of conditional branch vector wherein each uses different criteria to determine whether the branch is generated.

In a vector of the conditional branch type, the criteria to be considered when determining whether execution of the vector generates a branch may be provided by the operation portion and/or by external controls. External controls may include any data other than the vector being executed that is input to the portion of the test system that executes the test pattern vectors. As non-limiting examples, external controls may include one or more of: counters, register values, memory values, flag values or any other data accessible to the test system. In addition, a conditional branch may be generated indirectly in response to the data portion of a vector. For example, if a vector is executed and the data portion of the vector, by providing test values to a DUT, causes the value of a counter on the DUT to change and a conditional branch depends upon the counter value, the data portion may thereby effect the generation of a subsequent conditional branch.

As a non-limiting example of determining whether execution of a vector generates a branch, a vector may have an operation portion that indicates that the vector is of the type that will generate a branch upon execution when a signal of a particular value (e.g., a flag) is greater than a value received (e.g., from a test point on a DUT). Execution of this vector may therefore depend on the flag. If the flag is set, a branch will be generated, otherwise execution will proceed in a sequential fashion.

Some vectors may be of the conditional branch type though may always generate one of a plurality of possible branches based on the conditions. For example, a vector may branch to one of two destination locations based on whether a flag value is high or low. In this example, which of the two branches is generated may be determined based on the flag value. In such a situation, subsequent sequential processing of vectors may not occur because one of the two possible branches will always be generated by execution of the vector.

In a vector of the conditional branch type, a destination location within the test pattern determined when generating a branch may be provided by the operation portion and/or by external controls. For example, the operation portion of the vector being executed may indicate that if a branch is generated, the destination is a fixed displacement within the test pattern away from the location of the currently executed vector (e.g., if a branch is generated, the next instruction may be at a location 10 greater than the current location). As another example, external controls may indicate a destination location to be used when generating a branch.

By using the approaches outlined above to determine whether execution of a vector generates a branch and/or what the destination within the test pattern will be if the branch is generated, the behavior of the test system may be dynamically determined based on observed responses from a device under test or on other conditions that the test system is constructed to identify.

Some vectors may have an operation portion that defines the type of the vector to be a "no operation," a.k.a. "NOP" type. Such a vector may perform test operations based on the data portion of the vector, but may not be capable of generating a branch.

As a non-limiting example of the above techniques, FIG. 3 depicts test pattern 300 comprising 23 vectors in which the operation portion of each vector is represented by words in columns 302 and 303. The corresponding data portions of the vectors are not shown in FIG. 3 for simplicity. As per the above description, it will be appreciated that the underlying data used to represent the vectors being depicted in FIG. 3 can be configured in any suitable way, and that the interpretation of said data is represented by words in FIG. 3 for demonstrative purposes only.

In FIG. 3, the location of each vector in the test pattern is represented by a value in column 301. It will be appreciated that, as discussed above, the location value of each vector may be explicit or implicit in the test pattern, and that the location values represented in column 301 are presented in this way for clarity and are independent of any particular way that the location of vectors in a test pattern might be represented. As a non-limiting example, the location values of each of the 23 vectors in test pattern 300 may be implied by the order by which they are stored in memory.

In the example of FIG. 3, the vector at location 0, vector 311, has an operation portion that indicates the vector is of a type that will generate a branch based on the value of a particular flag "A." In the example of FIG. 3, this value has a possible value of either 0 or 1. If the flag value is 0, a branch will not be generated; if the flag value is 1 a branch will be generated. As described above, an external control such as Flag A may be accessed in any suitable way. For example, Flag A may be a signal output by a pin electronics circuit based on a value measure from the DUT or by some other part of the test system hardware.

In the example of FIG. 3, the operation portion indicates the potential destination of a branch generated by vector 311, which has a value corresponding to location 10 in test pattern 300. As described above, the location of the destination may be stored in the operation portion in any suitable way, such as by storing an absolute address location in the data portion, or by indicating an offset to the memory location of the vector being executed. Irrespective of the particular technique used to indicate the destination of the branch, in the example of FIG. 3 the execution of vector 311 will result either in the generation of a branch to location 10, and therefore the vector at location 10 being executed in the next cycle (if Flag A is set to 1); or the vector at location 1 being executed in the next cycle (if Flag A is set to 0, and because execution proceeded sequentially when a branch was not generated).

If a branch to location 10 was not generated by execution of vector 311 (because Flag A was set to 0), the flow of execution will proceed to sequentially execute vectors at locations 1, 2, 3, . . . . These vectors have operation portions that do not comprise a branch operation, and are shown as NOP-type vectors in the example of FIG. 3. It should be appreciated that the vectors indicated in FIG. 3 to have a NOP operation type may still perform test operations on a device under test that are characterized by the data portions of these vectors; for clarity the data portions of the vectors are not depicted in FIG. 3.

If a branch to location 10 was generated by execution of vector 311 (because Flag B was set to 1), the flow of execution will proceed to vector 313 at location 10. Vector 313 has an operation portion that indicates the vector is of a type that will generate a branch based on the value of a Flag B, which in the example of FIG. 3 has a value of 0 or 1. It will be appreciated that the value of Flag B may, for example, have a value based on a signal output by the DUT indicating a condition in some other part of the test system hardware.

The execution of vector 313 will result either in the vector at location 20 being executed in the next cycle (if Flag B is set to 1) or the vector at location 11 being executed in the next cycle (if Flag B is set to 0, and because execution proceeded sequentially when the branch was not taken).

Therefore, in the example of FIG. 3 there are four possible ways for the test pattern to be executed starting at location 0 and ending by executing the vector at location 22. First, execution of vectors 311 and 313 may generate a branch in both cases, leading to a total of 5 vectors being executed (0, 10, 20, 21, 22); second, execution of vector 311 may generate a branch while execution of vector 313 may not, leading to a total of 14 vectors being executed (0, 10, 11, 12, . . . 22); third, execution of vector 311 may not generate a branch while execution of vector 313 may generate a branch, leading to a total of 14 vectors being executed (0, 1, 2, . . . 10, 20, 21, 22); fourth, neither execution of vector 311 or vector 313 may generate a branch, leading to all 23 vectors being executed sequentially.

As described above, determining the destination of a branch may involve processing that a test system may not be able to complete within a single cycle of its operation. Consequently, in this situation the test system may not be able to execute a vector during every cycle of the test system's operation and processing may stall, possibly leading to incorrect test results.

For example, in the test pattern depicted in FIG. 3, if the test system were unable to access the destination location within a single cycle of the test system's operation, the test system will take two or more cycles to resume sequential execution after a branch is generated by execution of vector 311. As described above, the inventors have recognized and appreciated the use of multiple paths for processing operation portions of vectors in a test pattern may allow for same-cycle branching at faster processing speeds than were previously available. Such an improved pattern generator that makes use of multiple paths may be implemented, for example, in hardware, or in a combination of hardware and software.

FIG. 4 depicts a schematic view of a first exemplary pattern generator processing logic, according to some embodiments. In the example of FIG. 4, a pattern generator in an automatic test system includes processing logic 400. Processing logic 400 includes three processing paths each of which uses pipelined circuitry and which may be used to process vectors in a test pattern being executed. The first processing path "A" in FIG. 4 comprises registers 410-414 (labeled $A_0$, $A_1$, $A_2$, $A_3$ and $A_4$), the second processing path "B" comprises registers 420-424 (labeled $B_0$, $B_1$, $B_2$, $B_3$ and $B_4$), and the third processing path "C" comprises registers 430-434 (labeled $C_0$, $C_1$, $C_2$, $C_3$ and $C_4$). In the description of FIG. 4 below, processing in paths A, B and C comprises processing of the operation portions of vectors, however it should be appreciated that the paths may also be used to process any portion of vectors, including the whole vectors. In the preferred approach of processing operation portions of vectors, each register 410-414, 420-424 and 430-434 latches the operation portion of a vector between cycles.

The use of processing logic 400 in a pattern generator may allow sequential processing from different locations in a test pattern in each of the paths. For example, the paths A, B and C may begin to process operation portions of vectors prior to the time at which the vectors are executed after a branch type vector has been executed, and each outcome of the execution (i.e., a branch is/is not generated) may be represented by the contents of the paths. In this use case, irrespective of whether the branch is generated by execution of the vector or not, an operation portion from one of the paths may be selected and used to continue execution of the test pattern. This may be performed, for example, by using the operation portion to identify the data portion of the corresponding vector, and executing that data portion.

As a more detailed example, a vector capable of generating a branch is executed at location 5 in a test pattern, and it is determined that execution of this vector may generate a branch to location 12. In this example, a first processing path A may process the operation portions of the vectors at locations 6, 7, 8 and 9; and a second processing path B may process the operation portions of the vectors at locations 12, 13, 14 and 15. Whether a branch is generated or not, the test pattern vectors that will subsequently be executed have had their operation portions already processed for later execution. However, any other suitable scheme for processing test pattern locations may be utilized as will be described below, and the above is provided as merely an example.

Processing logic 400 includes decision logic 450, which determines which vectors will be processed in each path based on the operation portions being processed in the paths and on external controls 470, which are controls external to the processing logic (and may not be external to the pattern generator or the test system). Paths A, B and C each perform processing in a pipelined fashion, with operation portions within the paths moving through each path as an independent pipeline from left to right. For example, an operation portion latched in register 412 at the end of one cycle will be latched at register 413 at the end of the next cycle, and register 414 in the cycle after that. An operation portion processed in a right-most register (registers 414, 424 or 434) may not be processed in a subsequent cycle as it has reached the end of the pipeline.

Processing logic 400 also includes multiplexor 440 which is controlled by decision logic 450 via line 480 and which determines the output 445 of the processing logic that will be generated. The output 445 may specify the vector that will be executed by the pattern generator in which processing logic 400 is situated. For example, output 445 may specify the data portion of a vector to execute and thereby specify the application of pin electronics to a device under test. The output of multiplexor 440 may, for example, include a vector, the operation portion of a vector, and/or an indication of the location of a vector within the test pattern. In the example of FIG. 4, the multiplexor may select registers with a rank of two or greater for output, i.e. registers 412-414, 422-424 and 432-434. However, processing logic 400 could also be configured to allow any combination of registers within any number of processing paths to be output, as the invention is not limited in this way.

It may be advantageous for processing logic 400 to begin processing the operation portion of a vector at a location in the test pattern different from the location in the test pattern of a vector currently being executed by the test system. For example, if the test system is executing a vector at location 0, processing logic 400 may process the operation portion of the vector at location 2, which may allow processing logic 400 to begin determining possible branch destinations from execution of this vector before the system is prepared to execute it.

A more detailed example of this technique will be provided in relation to FIGS. 5A-I below. However, any suitable scheme to process an operation portion may be employed by processing logic 400.

Decision logic 450 initiates processing in paths A, B and C via lines 451, 452 and/or 453, respectively. When initiating processing, operation portions from sequential locations in the test pattern may be processed in an available path. For example, if the operation portion of a vector at location 0 is provided to path A (and is therefore latched between cycles at register 410), the decision logic may provide the operation portion of the vector at location 1 to path A in the next cycle. In this example, at the end of the next cycle the operation portion of the vector at location 0 will be latched at register 411 and the operation portion of the vector at location 1 will be latched at register 410.

In the example implementation of FIG. 4, the decision logic may process the operation portion of a vector to determine whether the execution of said vector is capable of generating a branch via lines 461, 462 and 463. For example, when an operation portion is processed between registers 411 and 412, the decision logic may perform processing of this operation portion to determine whether it is capable of generating a branch via line 461. It should be appreciated that the processing logic 400 may be configured to allow the decision logic to process an operation portion at any location(s) within a processing path, and that the particular configuration shown in FIG. 4 is provided as an example. It may be beneficial, for example, to analyze an operation portion from multiple positions within a processing path, and accordingly more lines than 461-463 included in the example of FIG. 4 may be provided from processing paths to the decision logic.

Based on processing of operation portions via lines 461-463, the decision logic may initiate sequential processing of operation portions from a location in the test pattern different from the location of the operation portions currently being processed in processing paths A, B or C. For example, when the decision logic determines that an operation portion in a first processing path is capable of generating a branch, sequential processing of operation portions at a possible branch destination may be initiated in a second processing path. However, it should be appreciated that the particular methods of adding paths described herein are provided as examples and any approach which makes a path available to the system may be utilized as the system is not limited in this respect.

Based on processing of vectors via lines 461-463, the decision logic may determine that the sequential processing of operation portions in a particular processing path should be terminated. For example, if the decision logic determines that it should initiate sequential processing in a new processing path, but all the processing paths are already performing sequential processing, the decision logic may prune one of the processing paths, which may be selected by determining that path is no longer needed. For example, if a branch was not generated by a vector capable of generating a branch, it may be unnecessary to continue sequential processing of operation portions from the branch destination that was previously initiated, because the test pattern will not branch to that destination at that time.

The pruning of a processing path may be performed in any suitable way, and is not limited to use cases where the decision logic determines that it should initiate sequential processing in a new processing path. For example, the decision logic may prune a processing path based on an indication that a branch was not generated. Pruning a processing path may include, for example, storing an indication that the processing path is available for use, and/or suspending sequential processing of operation portions within that processing path. However, it should be appreciated that the particular methods of pruning paths described herein are provided as examples and any approach which makes a path unavailable to the system may be utilized as the system is not limited in this respect.

It should be appreciated that the example of FIG. 4 is provided as an example configuration of a processing logic utilizing multiple processing paths, and that other embodiments of the invention may utilize other configurations not shown in FIG. 4. For example, any number of ranks and processing paths may be utilized, wherein the number of ranks need not be the same within each processing path. In addition, a multiplexor may select an output from any combination of registers within the processing paths, and the decision logic may process operation portions from any number of any positions within the processing paths.

FIGS. 5A-I depict a plurality of processing paths processing operation portions of test pattern vectors during multiple cycles of a test pattern generator, in accordance with some embodiments. In the example of FIGS. 5A-I, the processing logic depicted in FIG. 4 is used to perform processing of operation portions of the test pattern depicted in FIG. 3. FIGS. 5A-D depict the state of processing paths A, B and C during four cycles prior to the test system beginning execution of the test pattern 300 shown in FIG. 3. FIGS. 5E-I depict the state of processing paths A, B and C during the first five cycles of execution of test pattern 300 shown in FIG. 3.

At the beginning of the process depicted by FIGS. 5A-I, the processing logic begins to perform sequential processing of a test pattern beginning with the operation portion at position 0 in the test pattern. Accordingly, the decision logic begins by providing the operation portion at position 0 to a first processing path. As shown by table 510 in FIG. 5A, this is represented by a "0" in register 0 in path A (e.g., register 410 shown in FIG. 4). In the tables of FIGS. 5A-I an operation portion at a particular test pattern location is represented by a number in each table denoting the position of that operation portion in the test pattern. It should be appreciated that during operation an operation portion of a vector, for example, is processed in one of the processing paths, and that the numerical locations provided in FIGS. 5A-I are provided merely to indicate which operation portion is being processed at each step in the process.

In the next cycle, being the cycle three cycles prior to the test system beginning execution of the test pattern, sequential processing of the operation portions in processing path A continues as shown in FIG. 5B. The operation portion at position 0 has moved through the pipelined processing path to register 1, and the operation portion at position 1 has been provided by the decision logic to register 0.

During the next cycle, shown in FIG. 5C, the decision logic processes the operation portion from position 0 of the test pattern as it moves from register 1 to register 2 in path A. For example, the decision logic accesses this operation portion via line 461 shown in FIG. 4.

In the example of FIGS. 5A-I, the decision logic implements the following rule when processing an operation portion that is capable of generating a branch: initiate processing of operation portions in two paths by initiating processing of the operation portion at the branch destination in a first path, and by initiating processing of the operation portion located two steps in the test pattern after the branch destination in a second path. This rule is provided merely as an example of one such approach to processing operation portions using decision logic, and any suitable logical scheme may instead be used. Under this exemplary rule, the decision logic processing the operation portion from location 0 of the test pattern determines that this operation portion is capable of generating a branch to the vector at location 10 of the test pattern (as indicated by vector 311 shown in FIG. 3). Processing is thereby initiated in two paths based on this rule: in path B processing of the operation portion at location 10 of the test pattern is initiated, and in path C processing of the operation portion at location 12 is initiated.

During the next cycle, shown in FIG. 5D, the decision logic processes the operation portion from position 1 of the test pattern as it moves from register 1 to register 2 in path A. The decision logic accordingly determines that the operation portion from position 1 of the test pattern is not capable of generating a branch (because vector 312 shown in FIG. 3 is not of the branch type). Accordingly, each of the three paths that are processing operation portions continue to process the operation portions sequentially within their respective pipelines.

The next cycle, shown in FIG. 5E, is the first cycle in which the test system begins to execute vectors in the test pattern. As described above in relation to FIG. 4, the multiplexor 440 may provide an output 445 based on the contents of a register within a processing path, controlled by the decision logic 450. In the example of FIG. 5E, the multiplexor selects the operation portion in register 4 in path A to generate output by the processing logic. As described above, the output of the processing logic may indicate the vector that will be executed by the pattern generator in which processing logic 400 is situated. For example, the output of the processing logic may specify the data portion of a vector to execute and thereby specify the application of pin electronics to a device under test. Irrespective of the particular output of the processing logic, in this cycle the test system executes the vector located at position 0 in the test pattern based upon the output of the processing logic. Since this vector is of the conditional branch type, the state of the test system at that time will determine whether the branch is, or is not, generated.

In addition, during the cycle depicted by FIG. 5E, the decision logic processes operation portions as they move from register 1 to register 2 in each of paths A, B and C. In particular, the decision logic processes the operation portion from position 2 of the test pattern in path A, the operation portion from position 10 of the test pattern in path B, and the operation portion from position 12 of the test pattern in path C. For example, this processing may use lines 461, 462 and 463 shown in FIG. 4, respectively. In the example of FIG. 5E, the decision logic determines that, of these three operation portions, only the operation portion from position 10 of the test pattern is capable of generating a branch (based on the operation portions shown in table 300 in FIG. 3), which would be to location 20 in the test pattern. Accordingly, using the rule described above, processing is initiated in two paths: in path A processing of the operation portion at location 20 is initiated, and in path C processing of the operation portion at location 22 is initiated.

At the start of the cycle depicted by FIG. 5F, the branch condition of the operation portion at location 0 of the test pattern has been determined. In the example of FIG. 5F, the branch condition is triggered (e.g., the value of Flag A is set to 1 as per the example test pattern shown in FIG. 3), and accordingly the next vector to be executed is the vector at the destination location dictated by the branch. This vector is at location 10 of the test pattern, and accordingly in cycle 1 of the test system operation processing of operation portions is initiated in path B. In particular, the multiplexor will provide an output of the processing logic based on the content of register 3 in path B since this register has latched the operation portion of the vector at location 10. As shown by table 560 in FIG. 5F, the destination established by the branch type vector, and the vectors that may be executed subsequently, were previously established by the processing of the corresponding operation portions in processing path B. It is noted that, were a branch not generated by the vector at location 0 (e.g., the value of Flag A was set to 0 in the example test pattern), processing of operation portions would continue in path A and would instead cause the execution of the vector in location 1 of the test pattern.

During the cycle depicted by FIG. 5F, the test system executes the vector located at position 10 in the test pattern based upon the output of the processing logic. Since this vector is of the conditional branch type, the operation portion of this vector will determine whether the branch is, or is not, generated.

At the start of the cycle depicted by FIG. 5G, the branch condition of the conditional branch vector at location 10 of the test pattern has been determined. In the example of FIG. 5G, the branch condition is triggered (e.g., the value of Flag B is set to 1 as per the example test pattern shown in FIG. 3), and accordingly the next vector to be executed is the vector at the destination location dictated by the branch. This vector is at location 20 of the test pattern, and accordingly in cycle 2 of the test system operation processing of operation portions is initiated in path A starting from register 2.

During the cycle depicted by FIG. 5H, processing of operation portions continues in path A. While the decision logic continues to process operation portions as they move from register 1 to register 2 in each of paths A, B and C during each cycle, in the example of FIGS. 3, 4 and 5A-I, no operation portions other than those from locations 0 and 10 in the exemplary test pattern are capable of generating a branch. Accordingly, the decision logic does not determine that processing should be initiated in any new paths during cycles 1-4 represented by FIGS. 5F-I.

During the cycle depicted by FIG. 5I, processing of operation portions begins in path C. As can be seen in table 590, processing could continue by processing operation portions sequentially in path A. However, if an alternative path is processing the same operation portions using registers of a higher rank (e.g., register 4 being of a higher rank than register 2), it may be beneficial to initiate processing in that path to utilize the higher registers for processing. For example, if a multiplexor can provide output from the processing logic only from registers 2, 3 or 4 in each path, the test system may not be able to process a series of multiple branch type operation portions over consecutive cycles if the system is processing operation portions from register 2 in a particular path. A decision logic that will process from register 4 in a processing path when possible may therefore be better prepared to process any branch type vectors in the test pattern that appear subsequently.

Figure 6:
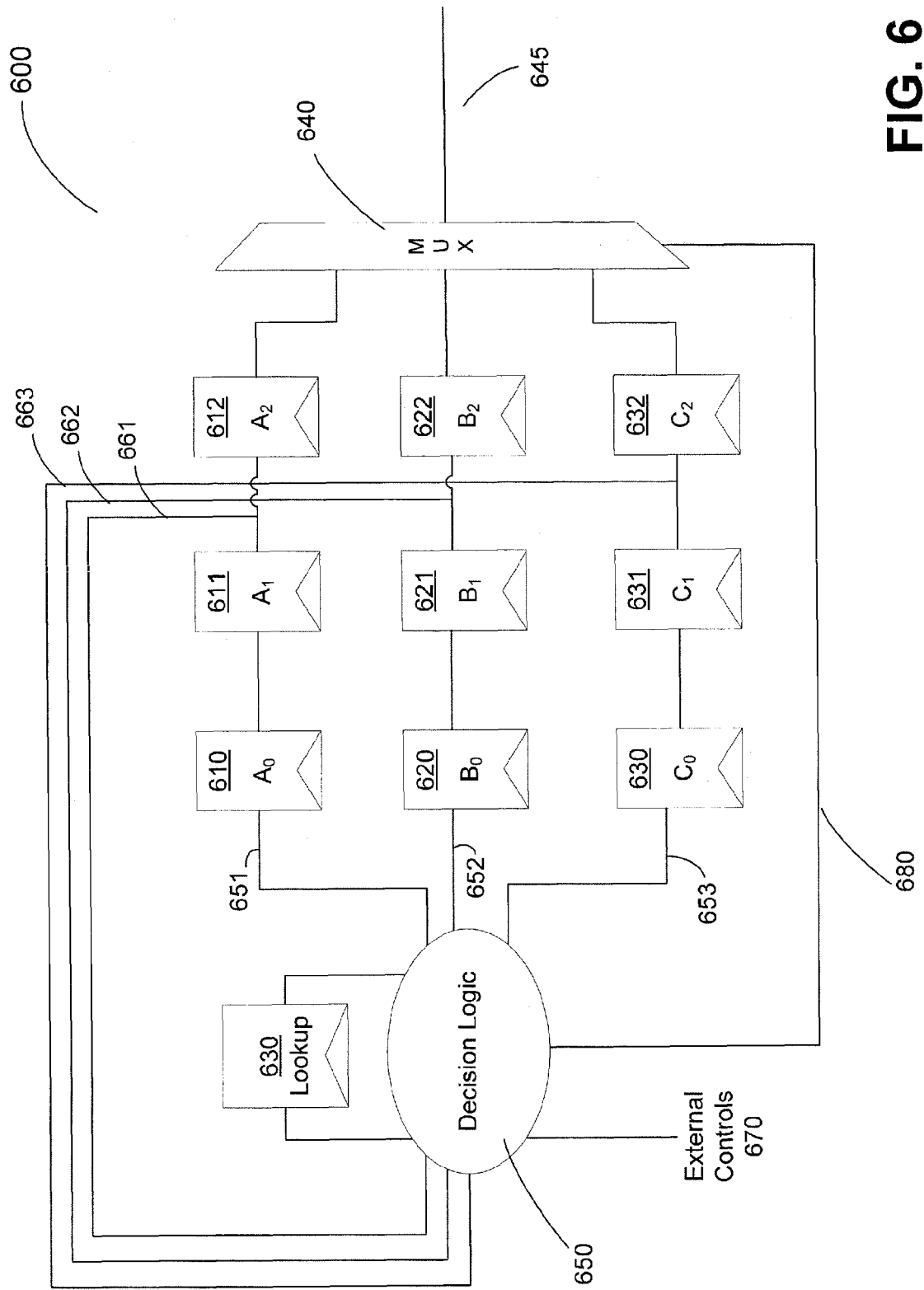
FIG. 6 is a schematic view of a second exemplary pattern generator processing logic, according to some embodiments.

FIG. 6 depicts a schematic view of a second exemplary pattern generator processing logic, according to some embodiments. In the example of FIG. 6, a pattern generator in an automatic test system includes processing logic 600 which makes use of lookup 630 to perform processing.

Processing logic 600 includes three processing paths each of which uses pipelined circuitry and which may be used to process operation portions in a test pattern being executed. The first processing path "A" in FIG. 6 comprises registers 610-612 (labeled $A_0$, $A_1$ and $A_2$), the second processing path "B" comprises registers 620-622 (labeled $B_0$, $B_1$ and $B_2$), and the third processing path "C" comprises registers 630-632 (labeled $C_0$, $C_1$ and $C_2$). In the description of FIG. 6 below, processing in paths A, B and C comprises processing of the operation portions of vectors, however it should be appreciated that the paths may also be used to process any portion of vectors, including the whole vectors. In the preferred approach of processing operation portions of vectors, each register 610-612, 620-622 and 630-632 latches the operation portion of a vector between cycles.

The use of processing logic 600 in a pattern generator may allow sequential processing from different locations in a test pattern in each of the paths. For example, the paths A, B and C may begin to process operation portions of vectors prior to the time at which the vectors are executed after a branch type vector has been executed, and each outcome of the execution (i.e., a branch is/is not generated) may be represented by the contents of the paths. In this use case, irrespective of whether the branch is generated by execution of the vector or not, an operation portion from one of the paths may be selected and used to continue execution of the test pattern. This may be performed, for example, by using the operation portion to identify the data portion of the corresponding vector, and executing that data portion.

Processing logic 600 includes decision logic 650, which determines which vectors will be processed in each path based on the operation portions being processed in the paths and on external controls 670, which are controls external to the processing logic (and may not be external to the pattern generator or the test system). Paths A, B and C each perform processing in a pipelined fashion, with operation portions within the paths moving through each path as an independent pipeline from left to right. For example, an operation portion latched in register 610 at the end of one cycle will be latched at register 611 at the end of the next cycle, and register 612 in the cycle after that. An operation portion processed in a rightmost register (registers 612, 622 or 632) may not be processed in a subsequent cycle as it has reached the end of the pipeline.

Processing logic 600 also includes multiplexor 640 which is controlled by decision logic 650 via line 680 and which determines the output 645 of the processing logic that will be generated. The output 645 may specify the vector that will be executed by the pattern generator in which processing logic 600 is situated. For example, output 645 may specify the data portion of a vector to execute and thereby specify the application of pin electronics to a device under test. The output of multiplexor 640 may, for example, include a vector, the operation portion of a vector, and/or an indication of the location of a vector within the test pattern. In the example of FIG. 6, the multiplexor may select any of the rightmost registers for output, i.e. registers 612, 622 and 623. However, processing logic 600 could also be configured to allow any combination of registers within any number of processing paths to be output, as the invention is not limited in this way.

The processing logic depicted in FIG. 6 makes use of software to analyze and compute possible branch destinations in advance of execution of a test pattern. For example, this analysis may be performed by software executing on a computer that may be separate from the test system, or may be performed by a component of the test system. In the example of FIG. 6, the possible destinations that may be generated by the execution of branch type vectors in a test pattern are computed and stored in lookup 630 prior to execution of the test pattern. This may allow decision logic 650 to begin processing operation portions in processing paths A, B and/or C based on data read from the lookup. Accessing the possible destination addresses in a lookup may be faster than computing those addresses, such that fewer pipeline ranks are shown in FIG. 6 than in FIG. 4. An example of such a process is described below in relation to FIGS. 7 and 8A-E.

Decision logic 650 initiates processing in paths A, B and C via lines 651, 652 and/or 653, respectively. When initiating processing, operation portions from sequential locations in the test pattern may be processed in an available path. For example, if the operation portion of a vector at location 0 is provided to path A (and is therefore latched between cycles at register 610), the decision logic may provide the operation portion of the vector at location 1 to path A in the next cycle. In this example, at the end of the next cycle the operation portion of the vector at location 0 will be latched at register 611 and the operation portion of the vector at location 1 will be latched at register 610.

When the decision logic determines that a vector being processed in one of the processing paths is capable of generating a branch based on reading data from lookup 630, the decision logic may initiate processing in one or more paths beginning at the branch destination(s) indicated by the lookup. For example, if the operation portion at location 1 in the test pattern is being processed in a first path and the lookup indicates that the vector at location 0, when executed, may generate a branch to location 15 in the test pattern, the decision logic may initiate processing of the operation portion at location 15 in a second path. Thereby, irrespective of whether the branch is generated or not by execution of the vector at location 1 in the test pattern, the multiplexor may be able to provide output corresponding to the next vector to be executed (whether the vector in location 2 or location 15).

It should be appreciated that the lookup may be performed in any one of numerous ways. For example, the operation portion of a vector being processed in a processing path or the address of a vector being processed in a processing may each be used to lookup possible branch destinations in the lookup. However, any suitable method for looking up branch destinations based on processing being performed in any number of processing paths may in general be used.

Processing logic 600 may use lines 661-663 to determine whether an operation portion of a vector being processed in one of the processing paths A, B or C will generate a branch when the vector is executed. This processing may allow the processing logic to determine which of the paths will be selected by multiplexor 640 for output. For example, an operation portion being processed in path A is capable of generating a branch, and an operation portion being processed in path B is an operation portion that may be subsequently processed if the branch is generated. In this example, line 661 may allow decision logic 650 to identify whether the operation portion in path A will actually generate a branch, and if so can control multiplexor 640 to select the operation portion from path B.

Based on the lookup 630 and/or external controls 670, the decision logic may determine that the sequential processing of vectors in a particular processing path should be terminated. For example, if the decision logic determines that it should initiate sequential processing in a new processing path, but all the processing paths are already performing sequential processing, the decision logic may prune one of the processing paths by determining that it is no longer needed. For example, if a branch was not generated by a vector capable of generating a branch, it may be unnecessary to continue sequential processing of operation portions from the branch destination that was previously initiated, since the test pattern will not branch to that destination at that time.

The pruning of a processing path may be performed in any suitable way, and is not limited to use cases where the decision logic determines that it should initiate sequential processing in a new processing path. For example, decision logic 650, or other suitable circuitry, may store in association with a path the branch instruction in response to which processing in that path was initiated. The decision logic may prune a processing path based on an indication that a branch was not generated. Pruning a processing path may include, for example, storing an indication that the processing path is available for use, and/or suspending sequential processing of operation portions within that processing path. However, it should be appreciated that the particular methods of pruning paths described herein are provided as examples and any approach which makes a path unavailable to the system may be utilized as the system is not limited in this respect.

It should be appreciated that the example of FIG. 6 is provided as an example configuration of a processing logic utilizing multiple processing paths, and that other embodiments of the invention may utilize other configurations not shown in FIG. 4. For example, any number of ranks and processing paths may be utilized, wherein the number of ranks need not be the same within each processing path. In addition, a multiplexor may select an output from any combination of registers within the processing paths, and the decision logic may process operation portions from any number of any positions within the processing paths.

In some use cases, it may be particularly advantageous to provide a processing logic as shown in FIG. 6 but utilizing four or more processing paths. Such a configuration may allow for processing of a test pattern that comprises any number of sequentially encountered operation portions capable of generating a branch. For example, there may be test patterns in which an operation portion capable of generating a branch is encountered and yet irrespective of whether the branch is generated the next operation portion encountered is also capable of generating a branch. In such a test pattern there will be four possible locations in the test pattern encountered two cycles after the initial operation portion. Accordingly, processing logic comprising four or more processing paths may be advantageous for processing such test patterns since such a processing logic would be able to initiate processing in each path to allow for each of the four possibilities.

FIG. 7 depicts an exemplary lookup storing test pattern locations, in accordance with some embodiments. In the example of FIG. 7, a software component has analyzed and computed possible branch destinations of each vector in the test pattern shown in FIG. 3. Table 700 represents the result of such analysis and may be suitable, for example, for use as lookup 630 shown in FIG. 6.

In FIG. 7, column 701 indicates a location of a vector in the test pattern and column 702 indicates any locations in the test pattern that may result as destinations resulting from the execution of the vector at that location. For example, in row 711, the vector at location 0, when executed, may generate a branch to location 10 as per vector 311 depicted in FIG. 3. Similarly, row 712 indicates that the vector at location 10 may, when executed, generate a branch to location 20 as per vector 313 depicted in FIG. 3.

It should be appreciated that the lookup data illustrated in FIG. 7 may in practice be represented in any suitable way and may be stored in any suitable location. For example, the lookup data may be stored in a memory and may utilize a number of bytes to represent a location followed by a number of bytes to represent a corresponding branch destination. However, this is merely an example and any suitable scheme for storing one or more locations in addition to branch destination(s) corresponding to each location may be utilized so long as the lookup data may be accessed by the test system.

FIGS. 8A-G depict processing in a plurality of processing paths processing operation portions of test pattern vectors during multiple cycles of a test pattern generator, in accordance with some embodiments. In the example of FIGS. 8A-G, the processing logic depicted in FIG. 6 is used to perform processing of operation portions of the test pattern depicted in FIG. 3. FIGS. 8A-B depict the state of processing paths A, B and C during two cycles prior to the test system beginning execution of the test pattern 300 shown in FIG. 3. FIGS. 8C-G depict the state of processing paths A, B and C during the first five cycles of execution of test pattern 300 shown in FIG. 3. In addition, the lookup data illustrated in FIG. 7 is used by the processing logic to determine possible branch destinations, using the approaches described above.

At the beginning of the process depicted by FIGS. 8A-G, the processing logic begins to perform sequential processing of a test pattern beginning with the operation portion at position 0 in the test pattern. Accordingly, the decision logic begins by providing the operation portion at position 0 to a first processing path. As shown by table 810 in FIG. 8A, this is represented by a "0" in register 0 in path A (e.g., register 610 shown in FIG. 6). In the tables of FIGS. 8A-G an operation portion at a particular test pattern location is represented by a number in each table denoting the position of that vector. It should be appreciated that during operation an operation portion of a vector, for example, may be processed in one of the processing paths, and that the numerical locations provided in FIGS. 8A-G are provided merely to indicate which operation portion is being processed at each step in the process.

In the next cycle, being the cycle one cycle prior to the test system beginning execution of the test pattern, sequential processing of the operation portions in processing path A continues as shown in FIG. 8B. The operation portion at position 0 has moved through the pipelined processing path to register 1, and the operation portion at position 1 has been provided to register 0 for processing. In addition, the decision logic examines the lookup data, as depicted by table 700 in FIG. 7, and determines that since the operation portion at position 0 was processed in the previous cycle, a branch to location 10 may potentially be generated in the cycle following the execution of the vector at that position. Accordingly, processing is initiated in path B of the operation portion at position 10 during this cycle.

The next cycle, shown in FIG. 8C, is the first cycle in which the test system begins to execute vectors in the test pattern. As described above in relation to FIG. 6, the multiplexor 640 may provide an output 645 based on the content of a register within a processing path, controlled by the decision logic 650. In the example of FIG. 8C, the multiplexor selects the operation portion in register 2 in path A to generate output by the processing logic. As described above, the output of the processing logic may indicate the vector that will be executed by the pattern generator in which processing logic 600 is situated. For example, the output of the processing logic may specify the data portion of a vector to execute and thereby specify the application of pin electronics to a device under test. Irrespective of the particular output of the processing logic, in this cycle the test system executes the vector located at position 0 in the test pattern based upon the output of the processing logic. Since this vector is of the conditional branch type, the operation portion of the vector will determine whether the branch is, or is not, generated.

Additionally, during the cycle shown in FIG. 8C the decision logic examines the lookup data, as depicted by table 700 in FIG. 7, and determines that since the operation portion at position 10 was processed in the previous cycle, a branch to location 20 may potentially be generated in the cycle following the execution of the vector at that location. Accordingly, processing is initiated in path C of the operation portion at position 20 during this cycle. In the subsequent cycles to be described below, the decision logic examines the lookup data and makes a determination as to whether a branch may be generated by operation portions being processed. However, in the present example no more branches may be generated by operation portions other than those at positions 0 or 10 in the test pattern, accordingly during subsequent cycles of processing the test pattern depicted in FIG. 3 the decision logic will not initiate any further paths based on the lookup data.

In cycle 1 shown in FIG. 8D, sequential processing is initiated in processing path B based on an evaluation of the branch condition in the operation portion at position 0. This processing may, for example, be initiated based on data provided to the decision logic via lines 661-663 shown in FIG. 6. In the test pattern depicted in FIG. 3, Flag A may have a value set to 1, which may generate a branch to location 10 in the test pattern after execution of the vector at location 0. In the example of FIGS. 8A-G, a branch is generated upon execution of the vector at location 0 in the test pattern, and accordingly sequential processing is initiated in processing path B, and the output of the processing logic is selected to be based upon the contents of register 2 in path B.

In cycle 2 shown in FIG. 8E, sequential processing is initiated in processing path C based on an evaluation of the branch condition in the operation portion at position 10. For example, in the test pattern depicted in FIG. 3, Flag B may have a value set to 1, which may generate a branch to location 20 in the test pattern after execution of the vector at location 10. In the example of FIGS. 8A-G, a branch is generated upon execution of the vector at location 10 in the test pattern, and accordingly sequential processing is initiated in processing path C, and the output of the processing logic is selected to be based upon the contents of register 2 in path C.

In cycles 3 and 4 shown in FIGS. 8F and 8G respectively, sequential processing continues in path C. One advantage of the processing logic configuration shown in FIG. 6 may be that the multiplexor is always able to provide an output from among the highest-ranked registers in a processing path (e.g., register 2 is the highest ranked register in the example of FIG. 6). Since branch destinations have been computed prior to execution, possible branch destinations may be accounted for by processing in available processing paths. So long as there are a sufficient number of available processing paths, the system may be able to handle any number of sequentially executed operation portions that each are capable of generating a branch by selecting the highest-ranked register for output in a processing path.

Figure 9:
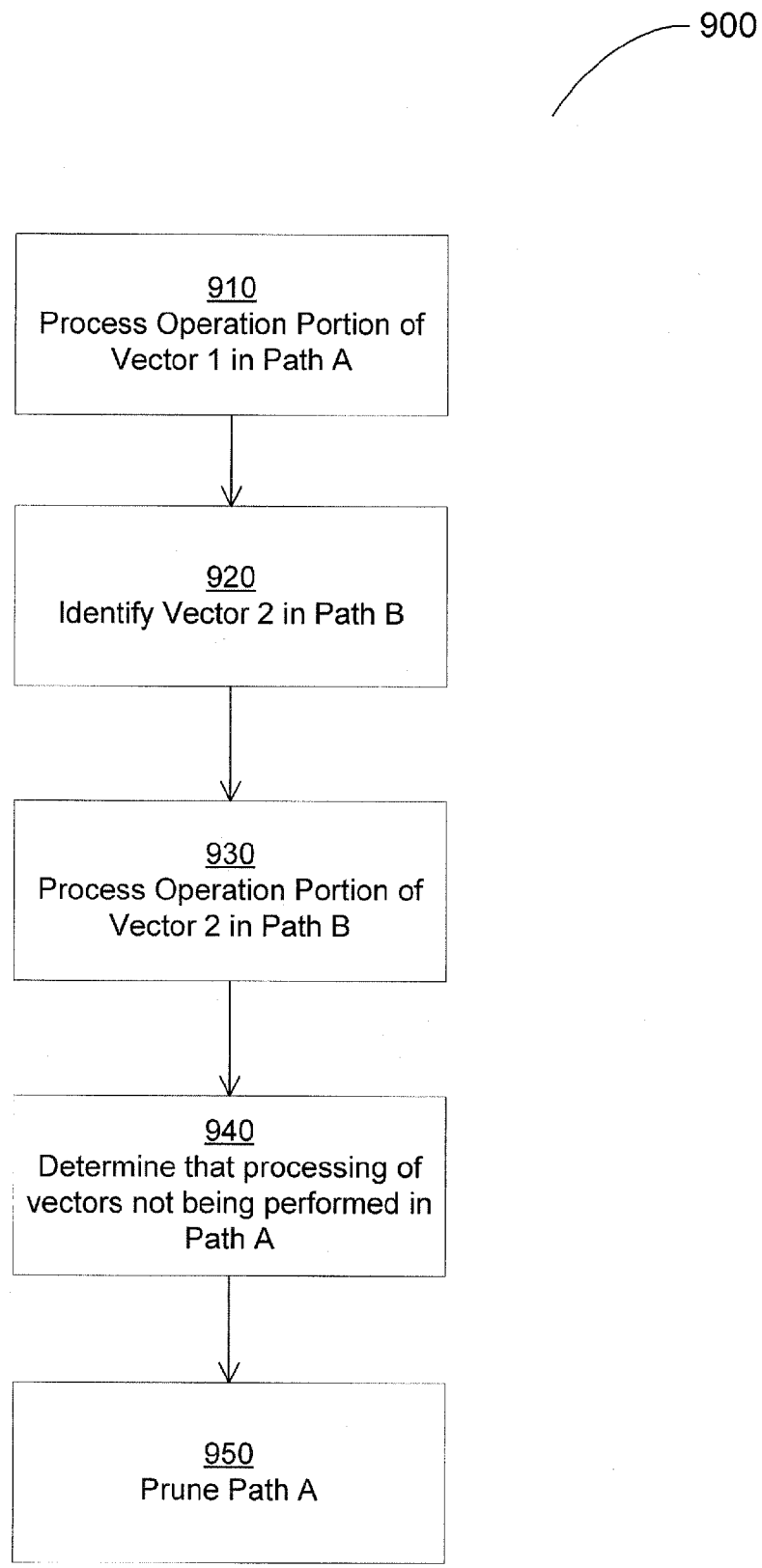
FIG. 9 shows a method of processing vectors in a plurality of paths, according to some embodiments.

FIG. 9 shows a method of processing operation portions in a plurality of paths, according to some embodiments. Method 900 shown in FIG. 9 may be performed on any suitable test system capable of processing operation portions in multiple processing paths, which include the embodiments described above.

Method 900 begins with act 910, in which the operation portion of a first vector in a test pattern is processed in a processing path A. In act 920, a second vector is identified that is being processing in a processing path B. The identification of the second vector may, for example, be based upon the processing of the operation portion of the first vector in act 910. For example, processing the operation portion of the first vector in act 910 may indicate that executing the first vector will generate a branch, and the second operation portion in processing path B may be identified based on this indication. However, the second vector may be identified in processing path B for any suitable reason.

In act 930, the operation portion of the second vector identified in act 920 is processed. For example, processing of the operation portion of the second vector may be performed during execution of the vector, or may be performed to determine whether execution of the vector is capable of generating a branch.

In act 940, it is determined that processing of operation portions is not being performed in processing path A. Such a determination may be performed at any time after act 930, for example during the same cycle of the testing system in which act 920 is performed, or in a subsequent cycle. The determination that processing of operation portions is not being performed in processing path A in act 940 may be performed in any suitable way, such as by identifying that operation portions are being processed in processing path B, which may for example by based upon processing of the second vector in act 930.

Irrespective of how it is determined that processing of operation portions is not being performed in processing path A, in act 950 processing path A is pruned. Pruning processing path A may, for example, entail storing an indication that processing path A is available for use and/or suspending processing of operation portions in processing path A. Though, said pruning may comprise any operation that allows the system to subsequently initiate processing in processing path A.

The various methods or processes outlined herein may be implemented in any suitable hardware, such as one or more processors, Field Programmable Gate Arrays (FPGAs) or Application Specific Integrated Circuits (ASICs). Additionally, the various methods or processes outlined herein may be implemented in a combination of hardware and of software executable on one or more processors that employ any one of a variety of operating systems or platforms. For example, the various methods or processes may utilize software to create or limit a test pattern and then utilize hardware to perform testing using the test pattern. The various methods or processes may also utilize software to perform a portion of automated testing and hardware to perform the remainder of the automated testing. An example of one such approach is described above. However, any suitable combination of hardware and software may be employed to realize any of the embodiments discussed herein.

In this respect, various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, implement the various embodiments of the present invention. The non-transitory computer-readable medium or media may be transportable, such that the program or programs stored thereon may be loaded onto any computer resource to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion among different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in non-transitory computer-readable storage media in any suitable form. For simplicity of illustration, data structures may be shown to have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art.

For example, techniques for the design and operation of a pattern generator in a test system were described. These techniques may be applied in other contexts. For example, sequential execution of programmed instructions in a microprocessor, or other computer system, may use techniques as described herein.

Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method of operating an automatic test system programmed with a test pattern comprising a plurality of vectors, the plurality of vectors each being associated with a location within the test pattern, and each of at least a portion of the plurality of vectors comprising an operation portion and a data portion, the operation portion defining an operation to determine a location of a subsequent vector during execution of the test pattern, and the data portion at least in part characterizing actions to be performed by the test system to generate or measure test signals at a plurality of test points of a device under test upon execution of the vector, the method comprising:

executing vectors in the test pattern with circuitry comprising a plurality of paths, each of the plurality of paths configured for processing operation portions of vectors and each of the plurality of paths pipelined with a plurality of ranks, the executing comprising:
   upon processing, in a first of the plurality of paths, an operation portion of a vector specifying an operation capable of generating a branch in the flow of execution of the vectors in the test pattern to a non-sequential location in the test pattern, initiating processing of the test pattern in a second of the plurality of paths from the non-sequential location; and
   selecting a value from an operation portion in a path of the plurality of paths, said selecting comprising selecting a path and a rank within the selected path from which to access the value.

2. The method of claim 1, wherein executing further comprises, for each of a plurality of cycles:
  accessing a data portion of a vector associated with a location having the selected value; and
  using the accessed data portion at least in part to control test signal operations for a device under test.

3. The method of claim 1, wherein executing further comprises:
  when initiating processing of the test pattern in a second of the plurality of paths, initiating processing of the test pattern in a third of the plurality of paths.

4. The method of claim 1, wherein:
  executing vectors in the test pattern comprises executing vectors in a plurality of cycles with same cycle branching.

5. The method of claim 1, further comprising:
  based on a determination that the flow of execution did not branch to the non-sequential location, pruning the second path.

6. The method of claim 5, wherein:
  pruning the second path comprises storing an indication that the second path is available for use.

7. The method of claim 1, wherein:
  processing an operation portion of a vector specifying an operation capable of generating a branch in the flow of execution of the vectors in the test pattern to a non-sequential location in the test pattern comprises dynamically computing the non-sequential location.

8. The method of claim 1, wherein:
  processing an operation portion of a vector specifying an operation capable of generating a branch in the flow of execution of the vectors in the test pattern to a non-sequential location in the test pattern comprises reading the non-sequential location from a memory.

9. The method of claim 8, wherein the memory is a lookup table.

10. The method of claim 8, further comprising:
  prior to executing vectors in the test pattern, computing for each of at least a portion of the plurality of vectors, at least one non-sequential location that is a possible destination of a branch in the flow upon execution of the vector; and
  storing an indication of the computed at least one non-sequential locations.

11. The method of claim 1, wherein the circuitry comprises a pattern generator.

12. An automatic test system programmed with a test pattern comprising a plurality of vectors, the plurality of vectors each being associated with a location within the test pattern, and each of at least a portion of the plurality of vectors comprising an operation portion and a data portion, the operation portion defining an operation to determine a location of a subsequent vector during execution of the test pattern, and the data portion at least in part characterizing actions to be performed by the test system to generate or measure test signals at a plurality of test points of a device under test upon execution of the vector, the system comprising:
  circuitry comprising a plurality of paths, each of the plurality of paths configured for processing operation portions of vectors and each of the plurality of paths pipelined with a plurality of ranks, the circuitry configured to execute vectors in the test pattern, the executing comprising:
    upon processing, in a first of the plurality of paths, an operation portion of a vector specifying an operation capable of generating a branch in the flow of execution of the vectors in the test pattern to a non-sequential location in the test pattern, initiating processing of the test pattern in a second of the plurality of paths from the non-sequential location; and
  decision logic configured to select a value from an operation portion in a path of the plurality of paths, said selecting comprising selecting a path and a rank within the selected path from which to access the value.

13. The system of claim 12, wherein executing further comprises, for each of a plurality of cycles:
  accessing a data portion of a vector associated with a location having the selected value; and
  using the accessed data portion at least in part to control test signal operations for a device under test.

14. The system of claim 12, wherein executing further comprises:
  when initiating processing of the test pattern in a second of the plurality of paths, initiating processing of the test pattern in a third of the plurality of paths.

15. The system of claim 12, wherein:
  executing vectors in the test pattern comprises executing vectors in a plurality of cycles with same cycle branching.

16. The system of claim 12, further comprising:
  decision logic configured to, based on a determination that the flow of execution did not branch to the non-sequential location, prune the second path.

17. The system of claim 16, wherein:
  pruning the second path comprises storing an indication that the second path is available for use.

18. The system of claim 12, wherein:
  processing an operation portion of a vector specifying an operation capable of generating a branch in the flow of execution of the vectors in the test pattern to a non-sequential location in the test pattern comprises dynamically computing the non-sequential location.

19. The system of claim 12, wherein:
  processing an operation portion of a vector specifying an operation capable of generating a branch in the flow of execution of the vectors in the test pattern to a non-sequential location in the test pattern comprises reading the non-sequential location from a memory.

20. The system of claim 19, wherein the memory is a lookup table.

21. The system of claim 19, wherein:
  the memory stores, for each of at least a portion of the plurality of vectors, an indication of at least one non-sequential location that is a possible destination of a branch in the flow upon execution of the vector computed prior to executing vectors in the test pattern.

22. The system of claim 12, wherein the circuitry further comprises a pattern generator.

* * * * *